(12) United States Patent
Brox et al.

(10) Patent No.: US 7,564,735 B2
(45) Date of Patent: Jul. 21, 2009

(54) MEMORY DEVICE, AND METHOD FOR OPERATING A MEMORY DEVICE

(75) Inventors: Martin Brox, München (DE); Thomas Hein, München (DE)

(73) Assignee: Qimonda AG, Munich (DE)

( * ) Notice: Subject to any disclaimer, the term of this patent is extended or adjusted under 35 U.S.C. 154(b) by 81 days.

(21) Appl. No.: 11/481,157

(22) Filed: Jul. 5, 2006

(65) Prior Publication Data

US 2008/0008023 A1 Jan. 10, 2008

(51) Int. Cl.
*G11C 7/00* (2006.01)
(52) U.S. Cl. .................. 365/230.03; 365/191
(58) Field of Classification Search ............ 365/230.03, 365/191, 189.2; 711/5, 167, 104
See application file for complete search history.

(56) References Cited

U.S. PATENT DOCUMENTS

| 6,226,755 | B1 | 5/2001 | Reeves |
| 6,349,051 | B1 | 2/2002 | Klein |
| 6,484,065 | B1 | 11/2002 | Yu et al. |
| 6,601,130 | B1 | 7/2003 | Silvkoff et al. |
| 6,788,592 | B2 * | 9/2004 | Nakata et al. ............... 365/191 |
| 7,046,538 | B2 | 5/2006 | Kinsley et al. |
| 2005/0021901 | A1 * | 1/2005 | Plesner ......................... 711/5 |
| 2005/0204100 | A1 | 9/2005 | Fukuzo |
| 2006/0092721 | A1 * | 5/2006 | Lee ............................ 365/191 |
| 2006/0230225 | A1 * | 10/2006 | Zitlaw ........................ 711/104 |
| 2007/0260841 | A1 * | 11/2007 | Hampel et al. .............. 711/167 |

* cited by examiner

*Primary Examiner*—Vu A Le
(74) *Attorney, Agent, or Firm*—Dicke, Billig & Czaja, PLLC

(57) ABSTRACT

A memory device, in particular to a DRAM, and a system comprising a memory device is disclosed. Further, the invention relates to a method for operating a memory device. According to an embodiment of the invention, a memory device is provided, including: a first chip select pin, and a second chip select pin. Further, a method for operating a memory device is provided, the memory device including a first chip select pin, and a second chip select pin, the method including: applying a chip select signal to the first or the second chip select pin.

18 Claims, 2 Drawing Sheets

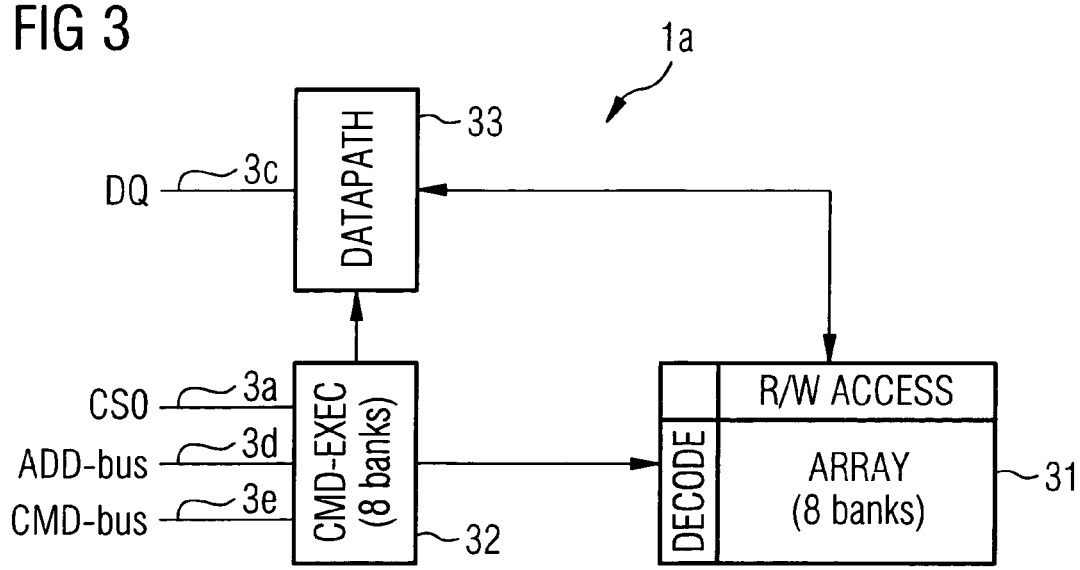
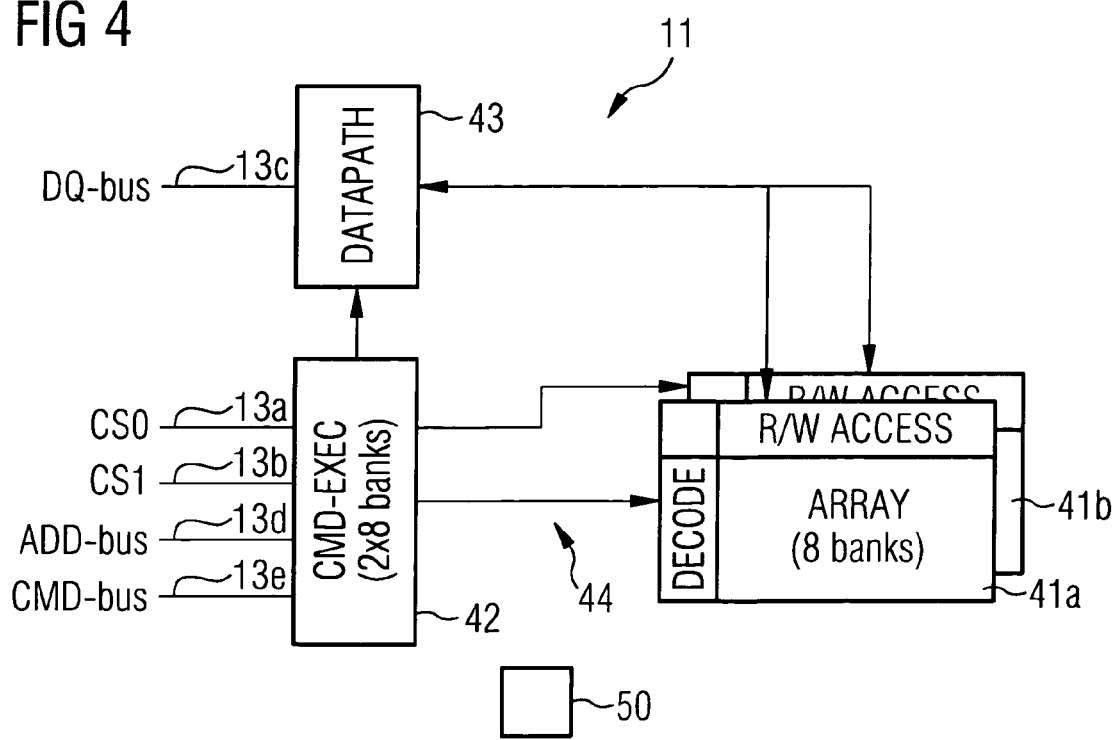

MEMORY DEVICE, AND METHOD FOR OPERATING A MEMORY DEVICE

BACKGROUND

The invention relates to a memory device, in particular to a DRAM, and a system having a memory device. Further, the invention relates to a method for operating a memory device.

In the case of conventional memory devices, in particular conventional semiconductor memory devices, one differentiates between functional memory devices (e.g., PLAs, PALs, etc.), and table memory devices, e.g., ROM devices (ROM=Read Only Memory—in particular PROMs, EPROMs, EEPROMs, flash memories, etc.), and RAM devices (RAM=Random Access Memory—in particular, e.g., DRAMs and SRAMs).

A RAM device is a memory for storing data under a predetermined address and for reading out the data under this address later. In the case of SRAMs (SRAM=Static Random Access Memory), the individual memory cells consist, e.g., of few, for instance 6, transistors, and in the case of DRAMs (DRAM=Dynamic Random Access Memory) in general only of one single, correspondingly controlled capacitive element.

In the case of memory devices, in particular DRAM devices, the individual memory cells are—positioned side by side in a plurality of rows and columns—arranged in a rectangular matrix or a rectangular array for technological reasons.

In order to obtain a correspondingly high total storage capacity and/or to achieve a data read or write rate that is as high as possible, a plurality of, e.g., two, four or eight—substantially rectangular—individual arrays may be provided in one single DRAM device or chip instead of one single array.

In conventional graphic systems, e.g., graphic systems 2 according to the GDDR3 or GDDR4 standard such as, e.g., illustrated in FIG. 1, one or—alternatively—two independent DRAM devices 1*a*, 1*b* might be provided per channel. Further, several channels might be provided, for instance, four channels (whereby to each channel one or—alternatively—two independent DRAM devices might be associated). For sake of simplicity, only one single channel is illustrated in FIG. 1.

In order to separately access the DRAM devices 1*a*, 1*b* of a respective channel, Chip Select (CS) Signals (here: a first Chip Select Signal (CS0), and a second Chip Select Signal (CS1)) are provided at system level.

The Chip Select Signals (CS0, CS1) are driven by a controller 5 on respective non-shared, separate chip select command lines 3*a*, 3*b* connected with a respective first and second chip select pin of the controller 5.

The first Chip Select Signal (CS0) may be provided via the chip select command line 3*a* to a chip select pin of the first DRAM device 1*a* (but not to a respective chip select pin of the second DRAM device 1*b*), and the second Chip Select Signal (CS1) may be provided via the chip select command line 3*b* to the chip select pin of the second DRAM device 1*b* (but not to the respective chip select pin of the first DRAM device 1*a*).

As is further illustrated in FIG. 1, in the graphic system 2, a respective data bus 3*c* (DQ-bus), address bus 3*d* (ADD-bus), and command bus 3*e* (CMD-bus) are provided, each of the buses 3*c*, 3*d*, 3*e* connected with the controller 5, and each of the DRAM devices 1*a*, 1*b* (i.e., with respective data, address and command pins provided there).

To perform a write or read access, a particular predetermined sequence of instructions has to be run through:

For instance, first, a respective DRAM device (i.e., either the DRAM device 1*a*, or the DRAM device 1*b*) is selected by an appropriate Chip Select Signal.

Then, by means of a word line activate command (activate command (ACT)) a corresponding word line defined by the row address is activated in a respective memory bank of the selected DRAM device.

Subsequently—by means of a corresponding read or write command (RD or WT command)—it is initiated that the corresponding data—then exactly specified by the corresponding column address—is output (or read in).

Next—by means of a word line deactivate command (e.g., a precharge command (PRE command))—the corresponding word line is deactivated again, and the corresponding memory bank is prepared for the next word line activate command (ACT).

In order to further increase the performance of the DRAM devices 1*a*, 1*b*, the controller 5 may—after the output of a corresponding word line activate command (ACT command) and of a corresponding read (or write) command (RD (or WT) command)—leave the respective word line in an activated state (i.e. the corresponding word line deactivate command (PRE command)—for the time being—is inhibited).

If then—which is, from a statistic point of view, the case very frequently—next a memory cell is accessed which is assigned to the same word line as the memory cell that was accessed last, the output of a further word line activate command (ACT command) can be omitted. Instead, the controller 5 may directly output a corresponding read (or write) command (RD (or WT) command).

By shrinking the size of the DRAM devices 1*a*, 1*b*, the costs for a respective DRAM device 1*a*, 1*b* might be decreased. However, if the controller 5 is to remain unchanged (in particular, with regards to the two Chip Select Signals (CS0, CS1) provided by two separate chip select pins of the controller 5), still, two separate DRAM devices 1*a*, 1*b* are necessary. These separate DRAM devices 1*a*, 1*b*, e.g., have to be tested separately, have to be mounted in two separate housings, which both have to be soldered into the system 2, etc., etc. Hence, compared with a solution with one single DRAM device (single-chip-solution), still, the systems costs are relatively high.

For these or other reasons, there is a need for the present invention.

SUMMARY

According to an aspect of the invention, a memory device is provided, including: a first chip select pin, and a second chip select pin. Further, a method for operating a memory device is provided, the memory device including a first chip select pin, and a second chip select pin, the method including: applying a chip select signal to the first or the second chip select pin.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

The elements of the drawings are not necessarily to scale relative to each other. Like reference numerals designate corresponding similar parts.

FIG. 3 illustrates a schematic representation of a prior art memory device of the memory system illustrated in FIG. 1.

FIG. 4 illustrates a schematic representation of a memory device of the memory system illustrated in FIG. 2 in accordance with an embodiment of the present invention.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 2:
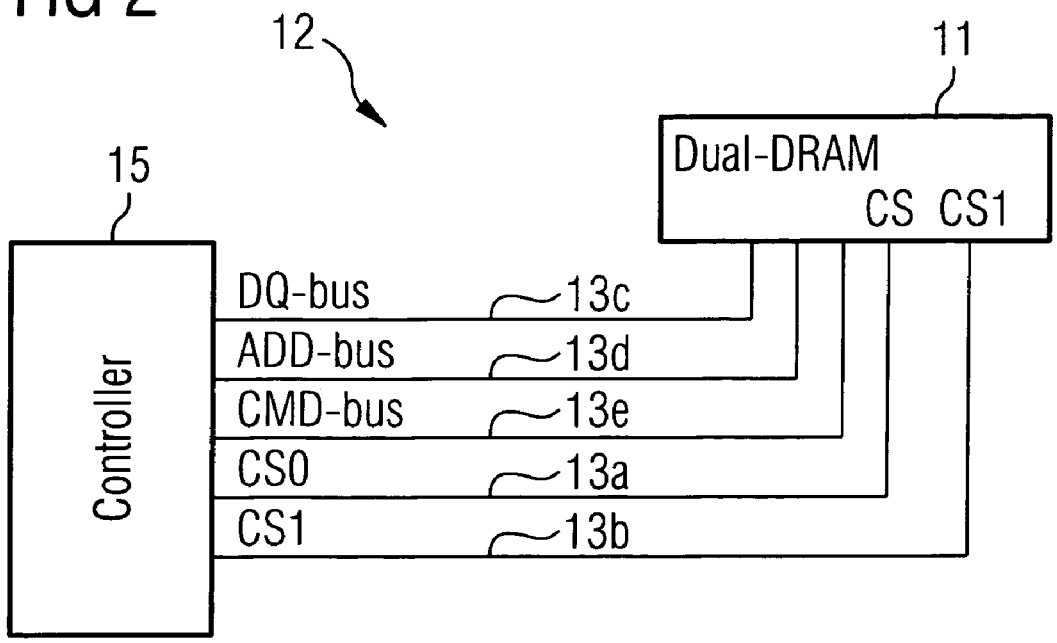
FIG. 2 illustrates a schematic representation of a memory system in accordance with an embodiment of the present invention.

FIG. 2 illustrates a schematic representation of a memory system 12 in accordance with an embodiment of the present invention.

The system 12, e.g., may be a graphic system, e.g., a graphic system 12 according to the GDDR3 or GDDR4 standard, or any other kind of electronic system.

As is illustrated in FIG. 2, the graphic system 12 includes a controller 15, and one or several memory devices 11.

Other than in the conventional graphic system 2 illustrated in FIG. 1, only one single memory device (here:, e.g., the memory device 11) is provided per channel, functioning—as will be described in further detail below—correspondingly identical or similar as the combination of the two independent memory devices 1a, 1b of the conventional graphic system illustrated in FIG. 1.

The memory device 11, e.g., might be a single-chip RAM device (RAM =Random Access Memory), for instance, a single-chip SRAM device (SRAM=Static Random Access Memory), or single-chip DRAM device (DRAM=Dynamic Random Access Memory), in particular, a single-chip DDR-DRAM device (DDR-DRAM=Double Data Rate DRAM).

In addition to the channel illustrated in FIG. 2, one or several further channels might be provided, e.g., a total of four (or eight, etc.) channels (whereby to each channel a memory device correspondingly similar to the memory device 11 illustrated in FIG. 2 might be associated).

Figure 1:
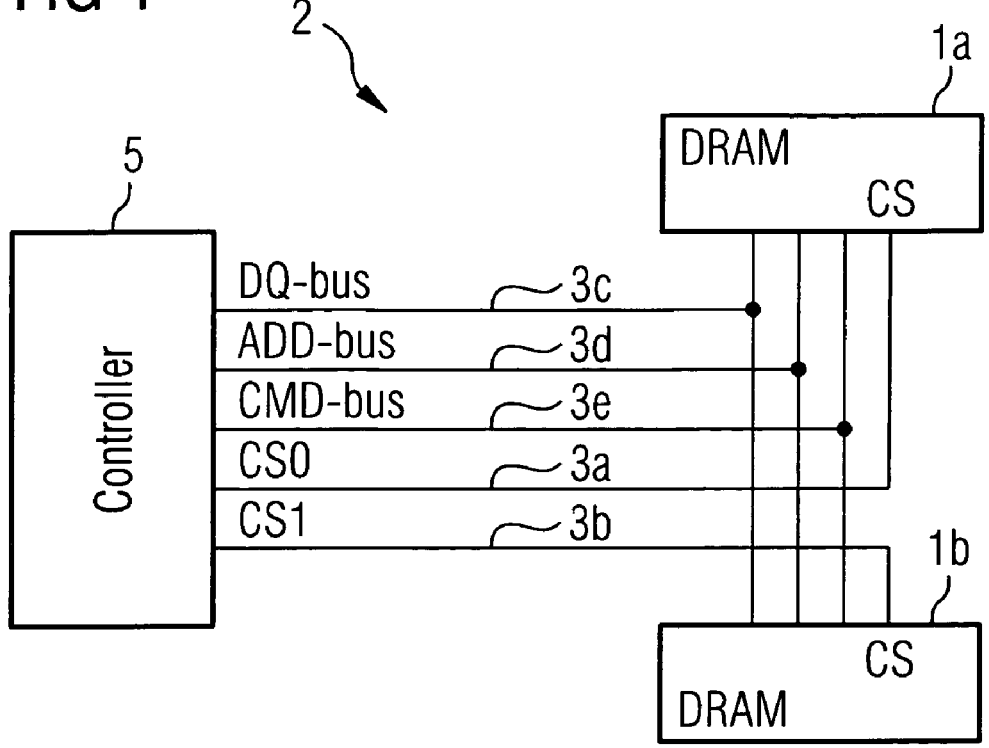
FIG. 1 illustrates a schematic representation of a memory system according to the prior art.

Even though only one single (single-chip) memory device 11 is provided per channel, just as in the conventional graphic system 2 illustrated in FIG. 1, two Chip Select (CS) Signals (here: a first Chip Select Signal (CS0), and a second Chip Select Signal (CS1)) are provided at system level.

The Chip Select Signals (CS0, CS1) correspondingly similar as in the conventional graphic system 2 illustrated in FIG. 1 are driven by the controller 15 on respective separate chip select command lines 13a, 13b connected with a respective first and second chip select pin of the controller 5.

The first Chip Select Signal (CS0) is provided via the chip select command line 13a to a first chip select pin of the memory device 11 (but not to a respective second chip select pin of the memory device 11), and the second Chip Select Signal (CS1) is provided via the chip select command line 13b to the second chip select pin of the memory device 11 (but not to the first chip select pin of the memory device 11).

As is further illustrated in FIG. 2, in the graphic system 12 correspondingly similar as in the conventional graphic system 2 illustrated in FIG. 1, a respective data bus 13c (DQ-bus), address bus 13d (ADD-bus), and command bus 13e (CMD-bus) are provided, each of the buses 13c, 13d, 13e connected with the controller 15, and the memory device 11 (i.e., with respective data, address and command pins provided there).

As is described in further detail below, the behavior of the memory device 11 for the controller 15 is similar or substantially similar to the behavior of the combination of the two independent memory devices 1a, 1b of the conventional graphic system illustrated in FIG. 1.

Hence, an identical or substantially identical controller 15 might be used in the graphic system 12 as in the conventional graphic system 2 illustrated in FIG. 1, using an identical or substantially identical protocol for performing, e.g., a write or read access, and identical or substantially identical signals and signal timings, in particular, identical or substantially identical timings for the two Chip Select Signals (CS0, CS1), and for any further Data-, Address- or Command-Signal provided on the above data bus 13c (DQ-bus), address bus 13d (ADD-bus), and command bus 13e (CMD-bus).

As the (single-chip) memory device 11 other than the separate memory devices 1a, 1b of the conventional graphic system 2 illustrated in FIG. 1 is mounted in one single housing (and as for the separate memory devices 1a, 1b separate tests have to be performed, etc., etc.) the costs of the graphic system 12 may be lower than the costs of the conventional graphic system 2 illustrated in FIG. 1.

FIG. 4 illustrates a schematic representation of the memory device 11 illustrated in FIG. 2.

Similar as in conventional DRAM devices, e.g., the conventional DRAM devices 1a, 1b of the conventional graphic system 2 illustrated in FIG. 1, in the memory device 11 the individual memory cells are—positioned side by side in a plurality of rows and columns—arranged in rectangular arrays 41a, 41b for technological reasons.

However, in the present embodiment, and as, e.g., illustrated in FIGS. 3 and 4, the memory device 11 includes twice as many arrays 41a, 41b as the conventional memory devices 1a, 1b of the conventional graphic system 2 illustrated in FIG. 1. For example, the conventional memory devices 1a, 1b each may only comprise one single array 31, and the memory device 11 according to an embodiment of the invention, e.g., two arrays 41a, 41b. In other words, the memory device 11 other than the memory devices 1a, 1b might be a "Dual-DRAM". Alternatively the conventional memory devices may each, e.g., include four arrays (or according to a further alternative, e.g., eight arrays, etc.), and the corresponding memory device according to an alternative embodiment of the invention, e.g., eight arrays (or according to the further alternative, e.g., sixteen arrays), etc., etc.

As is further illustrated in FIGS. 3 and 4, each of the arrays 31, and 41a, 41b of both the conventional memory device 1a, 1b and the memory device 11 according to an embodiment of the invention are sub-divided into the same number of memory banks (here:, e.g., 8 banks (or alternatively, e.g., 16 banks, etc.)).

Each of the arrays 31, and 41a, 41b of both the conventional memory device 1a, 1b and the memory device 11 according to an embodiment of the invention might provide the same data storage capacity (e.g., 512M (or alternatively, e.g., 256M, or, e.g., 1G, etc.).

Hence, due to the above higher number of arrays of the memory device 11, in total, the memory device 11 according to an embodiment of the invention might provide twice the storage capacity (e.g., 2×512M (or alternatively, e.g., 2×256M, or, e.g., 2×1G, etc.), as the conventional memory device 1a, 1b (however, the same storage capacity as the added-up (total) storage capacity of the first conventional memory device 1a of the conventional system 2, and the second conventional memory device 1b of the conventional system 2).

As mentioned above, the behavior of the memory device 11 for the controller 15 is similar or substantially similar to the behavior of the combination of the two independent memory devices 1a, 1b of the conventional graphic system 2 illustrated in FIG. 1. Hence, referring back to FIG. 2, to perform a write or read access, a similar or substantially similar sequence of instructions (with similar or substantially similar timing) has to be run through as in the conventional system 2:

For instance, first, the controller 15 may issue a corresponding Chip Select Signal, i.e., either a Chip Select Signal CS0 on the chip select command line 13a, or a Chip Select Signal CS1 on the chip select command line 13b, such as to either select a first or a second DRAM device for the respective access (even though only one single DRAM device, i.e., the above memory device 11 is provided for the respective channel). In the present embodiment, for instance, if the controller 15 intends to access a first DRAM device (e.g., by issuing a corresponding Chip Select Signal CS0 on the chip select signal 13a), the memory device 11 is accessed (in particular, the first array 41a of the memory device 11). Further, for instance, if the controller 15 intends to access a second, separate DRAM device (e.g., by issuing a corresponding Chip Select Signal CS1 on the chip select signal 13b), again, the memory device 11 is accessed (however, its second array 41b, instead of its first array 41a).

After the issuance of the respective Chip Select Signal, by means of a word line activate command (activate command (ACT)) a corresponding word line defined by the row address is activated in the respective memory bank of the respective array 41a, 41b of the memory device 11.

Subsequently—by means of a corresponding read or write command (RD or WT command)—it is initiated that the corresponding data—then exactly specified by the corresponding column address—is output (or read in).

Next—by means of a word line deactivate command (e.g., a precharge command (PRE command))—the corresponding word line is deactivated again, and the corresponding memory bank is prepared for the next word line activate command (ACT).

In order to further increase the performance of the DRAM device 11, the controller 15 may—after the output of a corresponding word line activate command (ACT command) and of a corresponding read (or write) command (RD (or WT) command)—leave the respective word line in an activated state (i.e. the corresponding word line deactivate command (PRE command) may—for the time being—be inhibited).

If then—which is, from a statistic point of view, the case very frequently—in the corresponding memory bank a memory cell is accessed next which is assigned to the same word line as the memory cell that was accessed last, the output of a further word line activate command (ACT command) can be omitted. Instead, the controller 15 may directly output a corresponding read (or write) command (RD (or WT) command).

As said above, the memory device 11 according to an embodiment of the invention may include twice as many arrays 41a, 41b as the conventional memory device 1a, 1b of the conventional graphic system 2 illustrated in FIG. 1.

However, as is illustrated in FIGS. 3 and 4, both the memory device 11 according to an embodiment of the invention and the conventional memory device 1a, 1b may include one single Command—Execution Control 32, 42 for controlling the array(s) 31, or 41a, 41b, respectively, and/or for controlling the respective bi-directional datapath 33, or 43, respectively. The datapath 43 of the memory device 11 may be constructed substantially similar to the datapath 33 of the conventional memory device 1a, 1b, however, the corresponding data is not only provided to or from one single array 31, but to or from each of the two arrays 41a, 41b provided in the memory device 11.

Respective address, command and/or data signals issued by the Command—Execution Control 42 on respective address, command and/or data lines 44 of the memory device 11i) may only be provided to one single memory bank (i.e., either to one single correspondingly chosen memory bank of the first array 41a, or alternatively to one single correspondingly chosen memory bank of the second array 41b), or ii) may only be provided to one of the arrays 41a, 41b (i.e., either to the first array 41a, or alternatively to the second array 41b), or iii) may be provided to both arrays 41a and 41b.

For the above cases i) and ii), the Chip Select Signals CS0, CS1 at the respective first and second chip select pins of the memory device 11 are evaluated, i.e., the state of the above chip select command lines 13a, 13b is taken into account: If the controller 15 has issued a Chip Select Signal (CS0) at the chip select command line 13a, in the above case i), the respective address, command and/or data signal is provided (by the Command—Execution Control 42) only to the respective memory bank of the first array 41a. If, instead, the controller 15 has issued a Chip Select Signal (CS1) at the chip select command line 13b, the respective address, command and/or data signal instead is provided by the Command—Execution Control 42 to the respective memory bank of the second array 41b. Further, in the above case ii), if the controller 15 has issued a Chip Select Signal (CS0) at the chip select command line 13a, the respective address, command and/or data signal is only provided (by the Command—Execution Control 42) to the first array 41a. If, instead, the controller 15 has issued a Chip Select Signal (CS1) at the chip select command line 13b, the respective address, command and/or data signal instead is provided by the Command—Execution Control 42 to the second array 41b.

As is further illustrated in FIG. 4, in an additional alternative of the present invention, optionally, an additional mode selection register 50 might be provided on the memory device 11. By use of the register 50 (more particularly, the data programmed into the register) it might be defined whether the memory device 11 is to be operated in a mode as described above (i.e., as a 2×512M (or 2×256M or 2×1G) "Dual-DRAM", where whenever a Chip Select Signal CS0 is applied at the first chip select pin of the memory device 11, the first array 41a is accessed, and whenever a Chip Select Signal CS1 is applied at the second chip select pin of the memory device 11, the second array 41b is accessed) or in a conventional mode (i.e., as a 1×1G (or 1×512M or 1×2G) "Single-DRAM" (where only one single chip select pin is operated—, e.g., only the above first chip select pin—, and where the answer to the question which of the two arrays 41*a*, or 41*b* is to be accessed does not depend on the state of respective chip select signals (in particular, the state of the chip select signal provided to the operated chip select pin), but on other signals provided to the memory device 11, e.g., respective address and/or array select signals, etc.)).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
   a single chip memory device having:
   at least a first chip select pin and a second chip select pin; and
   at least a first memory cell array and a second memory cell array, wherein a first mode of the memory device the first array is accessed depending on the state of the first chip select pin, and the second array is accessed depending on the state of the second chip select pin, and wherein a second mode of the memory device only one of the first and second chip select pins is operated, and the first and second arrays are accessed depending on the state of the one operated chip select pin;
   a register for defining whether the memory device is to operated in the first or the second mode; and
   a controller.

2. The system of claim 1, wherein the controller comprises at least a first chip select pin and a second chip select pin.

3. The system of claim 2, wherein the first chip select pin of the controller is connected via a first chip select signal line with the first chip select pin of the at least one memory device and the second chip select pin of the controller is connected via a second chip select signal line with the second chip select pin of the at least one memory device.

4. The system of claim 3, wherein the at least one memory device is a RAM device.

5. The system of claim 3, wherein the at least one memory device is a DRAM device.

6. The system of claim 3, wherein the system is a GDDR graphic system.

7. The system of claim 3, the controller being adapted to also be used in a further system where the first and second chip select pins of the controller are connected with separate memory devices.

8. A single-chip memory device, comprising:
   at least a first chip select pin, and a second chip select pin;
   at least a first memory cell a second memory cell array wherein a first mode of the memory device the first array is accessed depending on the state of the first chip select pin, and the second array is accessed depending on the state of the second chip select pin, and wherein a second mode of the memory device only one of the first and second chip select pins is operated and the first and second arrays are accessed depending on the state of the one operated chip select pin; and
   a register for defining whether the memory device is to be operated in the first or the second mode.

9. A method for operating a memory device, comprising:
   providing a memory device comprising a first memory cell array and a second memory cell array within a single semiconductor chip house, the housing having a first chip select pin and a second chip select pin; and
   applying a chip select signal to the first or the second chip select pin to access the first memory or second memory cell array in a first mode of the memory device;
   applying a chip select signal to only one of the first and second chip select pins in a second mode of the memory device, wherein the first and second memory cells are accessed depending on the state of the one of the first and second chip select pins to which the chip select signal is applied; and
   programming data in a mode select register to define whether the memory device operates in the first mode or the second mode.

10. A single chip memory device comprising:
    a first memory cell array;
    a second memory cell array;
    a first chip select pin configured to receive a first chip slect signal;
    a second chip select pin configured to receive a second chip select signal, the single chip memory device configured to operate in a dual array mode and alternatively in a single array mode, such that in the dual array mode the first memory cell array is accessed when the first chip select signal is asserted and the second memory cell array is accessed when the second chip select signal is asserted, awl in the single array mode the first and second arrays are jointly accessed based on an access signal when a selected one of the first and second chip select signals is asserted; and
    a mode select register having data stored therein which is programmable to define whether the single chip memory device is to be operated in the dual array mode or the single array mode.

11. The single chip memory device of claim 10, wherein the access signal comprises an address signal.

12. The single chip memory device of claim 10, wherein first and second memory cell arrays each comprise RAM arrays.

13. The single chip memory device of claim 10, wherein first and second memory cell arrays each comprise DRAM arrays.

14. The single chip memory device of claim 10, wherein the single chip memory device comprises a GDDR-DRAM device.

15. A single-chip memory device, comprising:
    a housing into which one single chip is mounted, the housing comprising a first chip select pin, and a second chip select ping, the one single chip comprising a first memory cell array, and a second memory cell array, wherein the first array is accessed depending on the state of the first chip select pin, and the second array is accessed depending on the state of the second chip select pin.

16. The single-chip memory device of claim 15, wherein the memory device is a RAM device.

17. The single-chip memory device of claim 16, wherein the RAM device is a DRAM device.

18. The single-chip memory device of claim 17, wherein the DRAM device is a GDDR-DRAM device.

* * * * *